US 6,566,208 B2

(12) United States Patent
Pan et al.

(10) Patent No.: US 6,566,208 B2
(45) Date of Patent: May 20, 2003

(54) METHOD TO FORM ELEVATED SOURCE/ DRAIN USING POLY SPACER

(75) Inventors: Yang Pan, Singapore (SG); Lee Yong Meng, Singapore (SG); Leung Ying Keung, Aberdeen (HK); Yelehanka Ramachandramurthy Pradeep, Singapore (SG); Jia Zhen Zheng, Singapore (SG); Lap Chan, San Francisco, CA (US); Elgin Quek, Singapore (SG); Ravi Sundarensan, San Jose, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/912,607

(22) Filed: Jul. 25, 2001

(65) Prior Publication Data

US 2003/0022450 A1 Jan. 30, 2003

(51) Int. Cl.[7] .............................................. H01L 21/336
(52) U.S. Cl. ....................... 438/300; 438/304; 438/564; 438/596
(58) Field of Search ................................ 438/300, 304, 438/299, 596, 564

(56) References Cited

U.S. PATENT DOCUMENTS

| 4,488,162 A | | 12/1984 | Jambotkar ..................... 357/23 |
|---|---|---|---|
| 5,015,594 A | * | 5/1991 | Chu et al. ..................... 43/201 |
| 5,089,435 A | * | 2/1992 | Akiyama ..................... 438/596 |
| 5,386,133 A | | 1/1995 | Hiroki et al. ................ 257/344 |
| 5,599,726 A | * | 2/1997 | Pan .............................. 439/304 |
| 5,631,482 A | | 5/1997 | Hong .......................... 257/326 |
| 5,682,055 A | * | 10/1997 | Huang et al. ................ 257/408 |
| 5,684,319 A | | 11/1997 | Hébert ........................ 257/336 |
| 5,710,054 A | * | 1/1998 | Gardner et al. ............. 438/304 |
| 6,103,580 A | * | 8/2000 | Guo ............................ 438/305 |
| 6,165,830 A | * | 12/2000 | Lin et al. .................... 438/238 |
| 6,225,175 B1 | * | 5/2001 | Houston ..................... 438/304 |

* cited by examiner

Primary Examiner—Michael Trinh
(74) Attorney, Agent, or Firm—George O. Saile; Rosemary L. S. Pike

(57) ABSTRACT

A method for forming a sub-quarter micron MOSFET having an elevated source/drain structure is described. A gate electrode is formed over a gate dielectric on a semiconductor substrate. Ions are implanted into the semiconductor substrate to form lightly doped regions using the gate electrode as a mask. Thereafter, dielectric spacers are formed on sidewalls of the gate electrode. A polysilicon layer is deposited overlying the semiconductor substrate, gate electrode, and dielectric spacers wherein the polysilicon layer is heavily doped. The polysilicon layer is etched back to leave polysilicon spacers on the dielectric spacers. Dopant is diffused from the polysilicon spacers into the semiconductor substrate to form source and drain regions underlying the polysilicon spacers. The polysilicon spacer on an end of the gate electrode is removed to separate the polysilicon spacers into a source polysilicon spacer and a drain polysilicon spacer thereby completing formation of a MOSFET having an elevated source/drain structure in the fabrication of an integrated circuit device.

19 Claims, 6 Drawing Sheets

METHOD TO FORM ELEVATED SOURCE/DRAIN USING POLY SPACER

BACKGROUND OF THE INVENTION

1. Field of the Invention

The invention relates to the fabrication of integrated circuit devices, and more particularly, to a method of forming an elevated source/drain MOSFET structure in the fabrication of integrated circuits.

2. Description of the Prior Art

As devices are scaled down, short channel effects become severe. That is, as the dimensions of the gate are reduced, the threshold voltage of the MOSFET becomes less predictable. Short channel effects cause source/drain leakage and voltage roll-off. To prevent short-channel effects, shallow source/drain junctions must be used. However, shallow junctions cause problems when forming salicide, such as junction leakage. An elevated source/drain structure can reduce short channel effects without these problems.

A number of workers in the art have proposed elevated source/drain structures. U.S. Pat. Nos. 5,386,133 to Hiroki, 5,631,482 to Hong, and 5,684,319 to Hebert disclose methods of forming polysilicon spacers as source/drain contacts. U.S. Pat. No. 4,488,162 to Jambotkar shows a raised source/drain process.

SUMMARY OF THE INVENTION

A principal object of the present invention is to provide an effective and very manufacturable method of forming a MOSFET having an elevated source/drain structures.

A further object of the invention is to provide a method of forming a sub-quarter micron MOSFET having an elevated source/drain structure wherein short channel effects are reduced.

Yet another object is to provide a method of forming a sub-quarter micron MOSFET having an elevated source/drain structure wherein source/drains are extended by out-diffusion from the elevated source/drains.

In accordance with the objects of this invention a method for forming a sub-quarter micron MOSFET having an elevated source/drain structure is achieved. A gate electrode is formed over a gate dielectric on a semiconductor substrate. Ions are implanted into the semiconductor substrate to form lightly doped regions using the gate electrode as a mask. Thereafter, dielectric spacers are formed on sidewalls of the gate electrode. A polysilicon layer is deposited overlying the semiconductor substrate, gate electrode, and dielectric spacers wherein the polysilicon layer is heavily doped. The polysilicon layer is etched back to leave polysilicon spacers on the dielectric spacers. The polysilicon spacers form elevated source/drain regions. Dopant is diffused from the polysilicon spacers into the semiconductor substrate to form source and drain extension regions underlying the elevated source/drain regions. The polysilicon spacer on an end of the gate electrode is removed to separate the elevated source/drain regions into an elevated source region and an elevated drain region thereby completing formation of a MOSFET having an elevated source/drain structure in the fabrication of an integrated circuit device.

BRIEF DESCRIPTION OF THE DRAWINGS

In the accompanying drawings forming a material part of this description, there is shown:

FIGS. 1 through 7A schematically illustrate in cross-sectional representation a preferred embodiment of the present invention.

DESCRIPTION OF THE PREFERRED EMBODIMENTS

Figure 1:
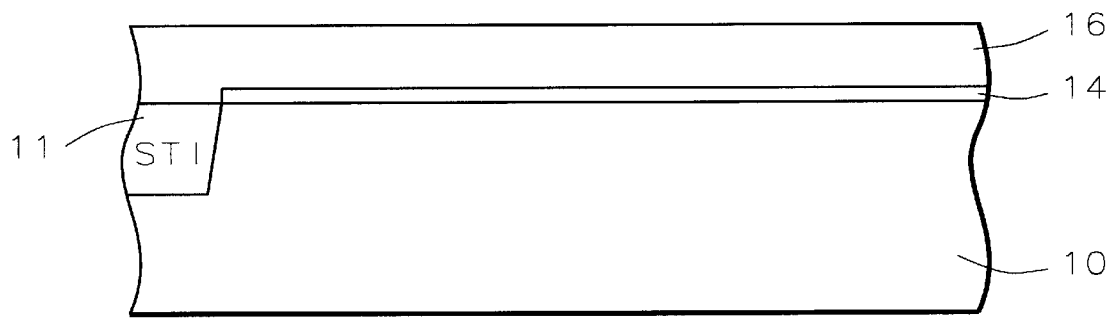

Referring now more particularly to FIG. 1, there is shown an illustration of a portion of a partially completed metal oxide field effect transistor (MOSFET). The semiconductor substrate 10 is preferably composed of silicon having a (100) crystallographic orientation and has been doped to be a p-type substrate. It will be understood by those skilled in the art that while FIGS. 1 through 10 illustrate an N channel MOSFET integrated circuit device, a P channel FET integrated circuit device could be formed simply by substituting opposite polarities to those given for the N channel embodiment. Also, in a similar way, a CMOSFET could be formed by making both N channel and P channel devices upon the same substrate.

In an effort to simplify the description and the drawings the dielectric isolation between devices has been only partially shown and will not be described in detail, because they are conventional. For example, shallow trench isolation region 11 can be formed in the semiconductor substrate, as shown.

A gate dielectric layer 14 is formed on the surface of the semiconductor substrate, for example, using thermal oxidation to form a silicon dioxide layer having a thickness of between about 10 and 100 Angstroms. Next, a polysilicon layer 16 is deposited over the gate dielectric layer to a thickness of between about 1000 and 4000 Angstroms by low pressure chemical vapor deposition (LPCVD), for example.

Figure 2:
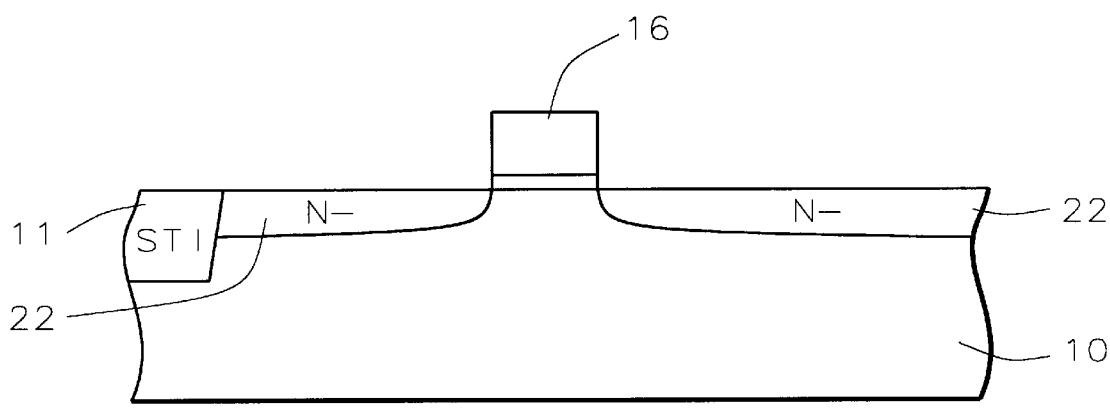

Referring now to FIG. 2, the polysilicon layer and gate dielectric layer are patterned to form a gate electrode 16. Ions are implanted into the surface of the substrate, using the gate electrode as a mask, to form lightly doped regions 22. For example, the lightly doped regions 22 may be formed by implanting ions into the substrate at an energy of 0.1 to 50 KeV and dosage of $10^{13}$ to $10^{15}$ atoms/cm$^2$. For NMOS, phosphorus ions are implanted while for PMOS, boron ions are implanted.

Figure 3:
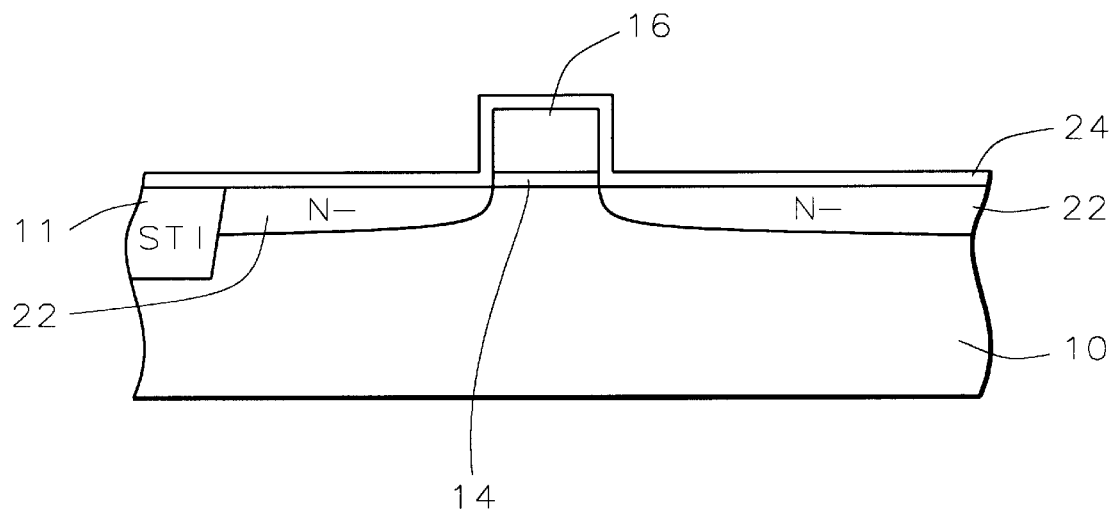

Now, a dielectric layer, such as an oxide layer, 24 is deposited over the substrate and the gate electrode to a thickness of between about 25 and 200 Angstroms, as shown in FIG. 3. The oxide layer could be thermally grown, but deposited oxide is preferred because of better uniformity.

Figure 4:
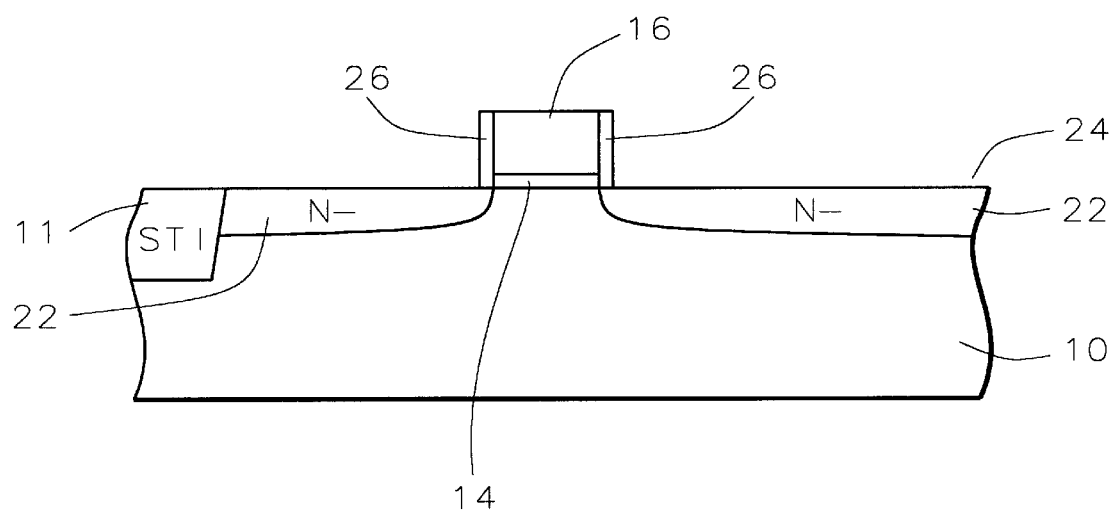

The oxide layer 24 is anisotropically etched back to leave oxide spacers 26 on the sidewalls of the gate 16. The oxide is removed on top of the gate electrode and on top of the lightly doped regions 22, as shown in FIG. 4.

Figure 5:
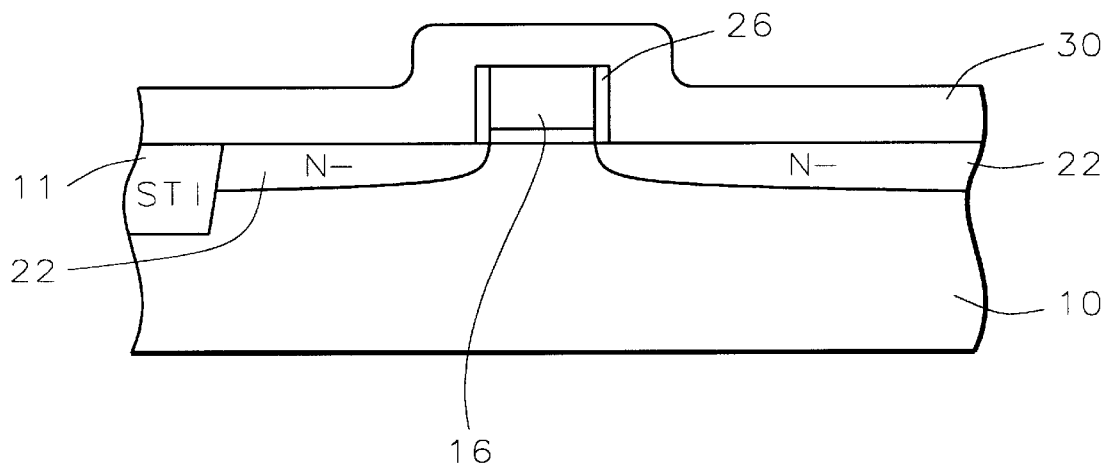

A second polysilicon layer 30 is blanket deposited over the gate electrode and the substrate, as shown in FIG. 5. The polysilicon layer is deposited, for example, by LPCVD to a thickness of between about 500 and 4000 Angstroms. The polysilicon layer is heavily doped with an N+ dopant (or with a P+ dopant for the PMOS case) in the concentration of between about $10^{20}$ and $10^{22}$ atoms/cm$^3$. The polysilicon layer may be doped in-situ to save process steps or may be doped by ion implantation after deposition.

Figure 6:
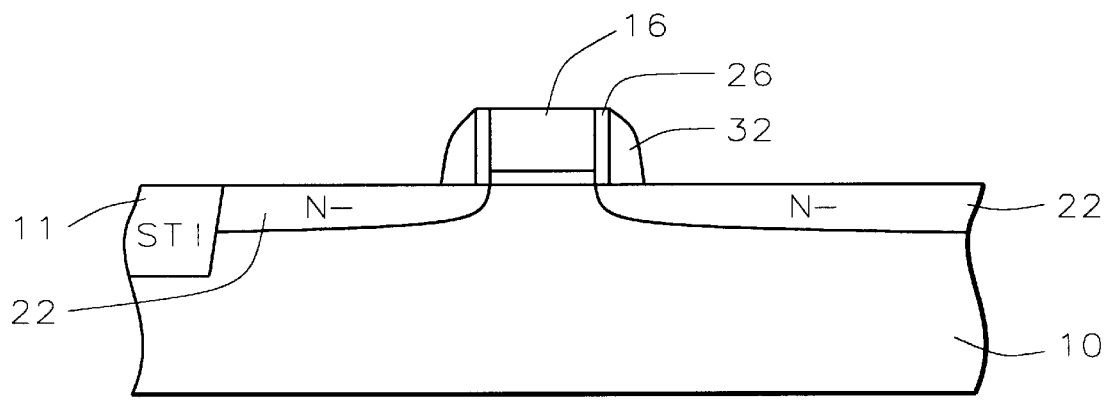

Referring now to FIG. 6, the polysilicon layer 30 is anisotropically etched back to leave polysilicon spacers 32 on the sidewalls of the gate electrode and separated from the gate electrode by the oxide spacers 26. The polysilicon spacers 32 will form the elevated source and drain regions.

Figure 7A:
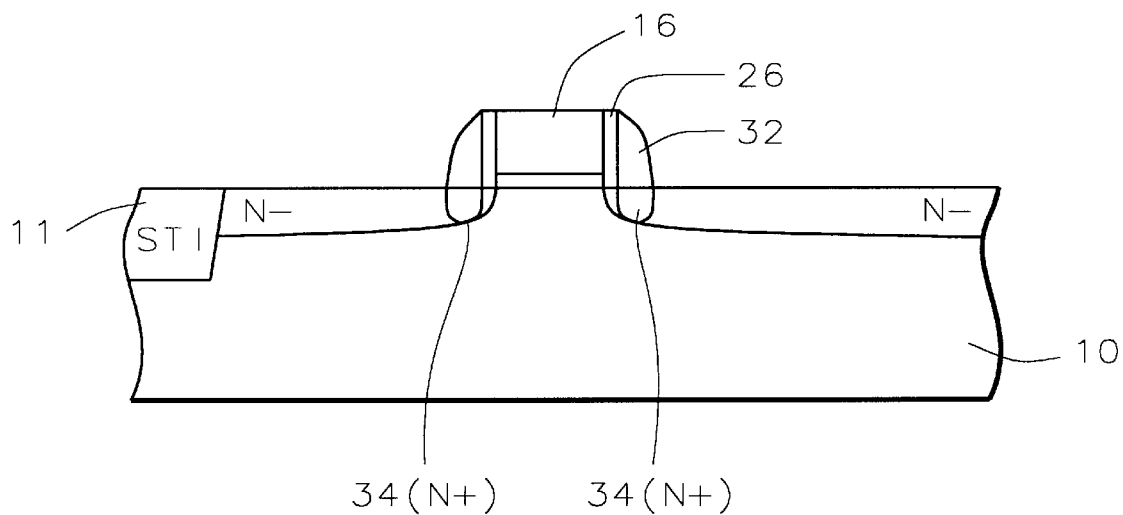
Figure 7B:
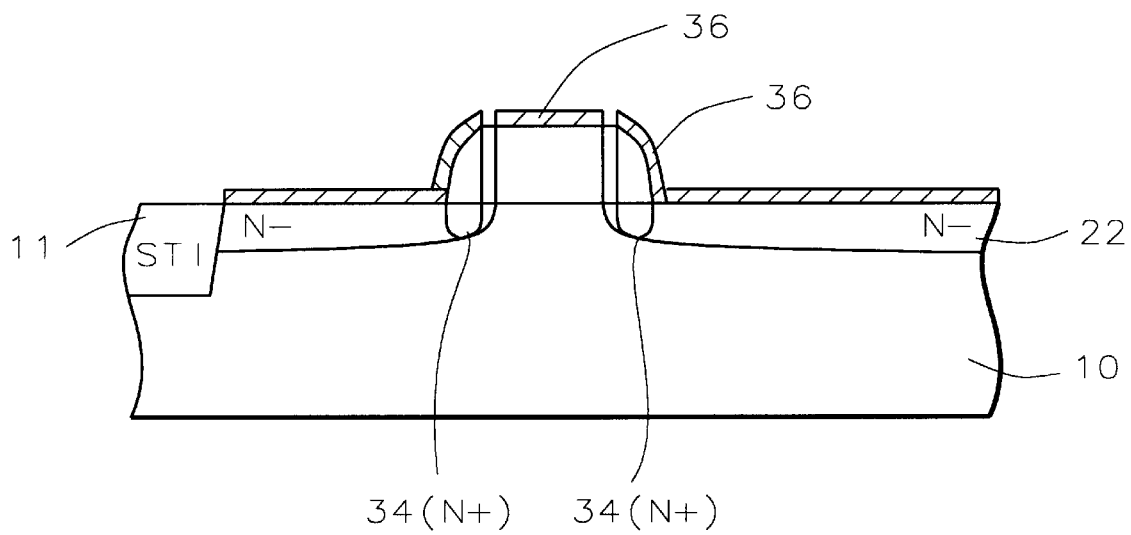
FIG. 7B schematically illustrates in cross-sectional representation an optional process in a preferred embodiment of the present invention.

After formation of the polysilicon spacers, a thermal cycle is used to drive in the dopant to form source/drain extensions 34 within the substrate underlying the elevated source/drain structures 32, as illustrated in FIG. 7A. For example, the thermal cycle could be a rapid thermal process (RTP) at 800 to 1100° C. for 10 to 50 seconds.

This completes the formation of the MOSFET with elevated source/drain structure. The outdiffused junction is very shallow, thus avoiding short channel effects. At the same time, the elevated polysilicon source/drain 32 does not present problems when forming salicide. The elevated source and drain can be salicided without junction leakage issues. Salicide layer 36 is illustrated overlying the N− regions 22, elevated source/drain 32, and gate electrode 16 in FIG. 7B. The salicide layer 36 is not shown in subsequent figures, but it is to be understood that it may be present.

Figure 8:
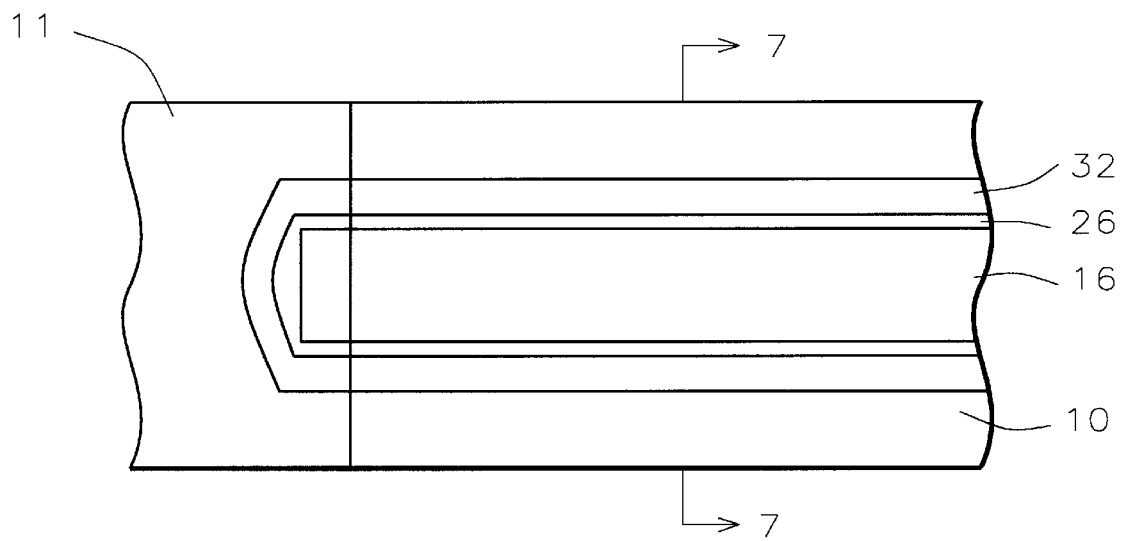
FIGS. 8 and 9 schematically illustrate in top view a preferred embodiment of the present invention.
Figure 9:
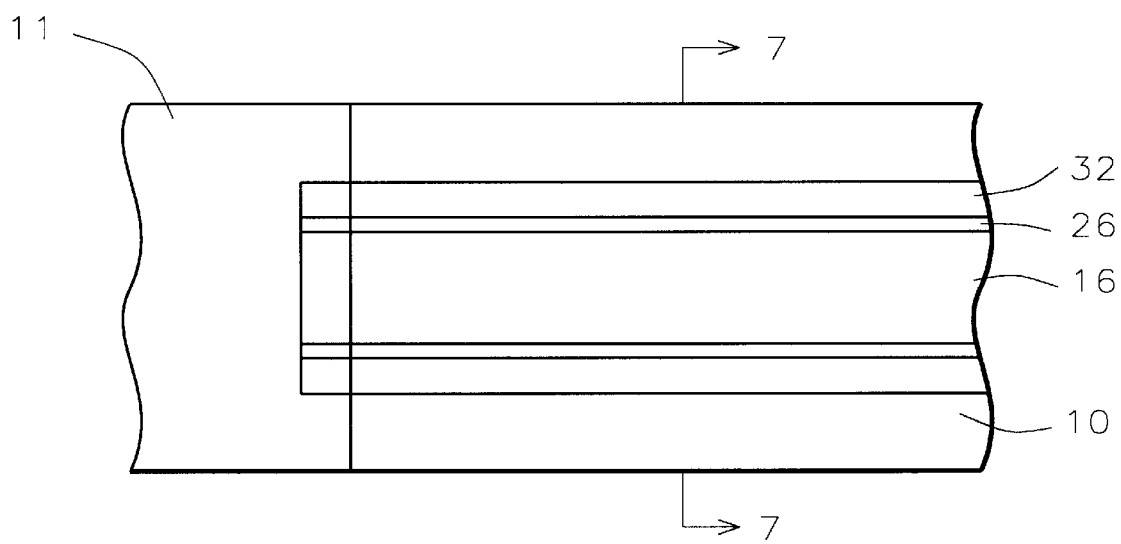

FIG. 8 illustrates a top view of the gate 16 and elevated source/drain contacts 32. An additional masking process is necessary to remove the polysilicon spacer 32 at the end of the gate 16 in order to separate the source/drain. FIG. 9 illustrates a top view of the gate and source/drain contacts after the polysilicon spacer at the end of the gate 16 has been removed.

Figure 10:
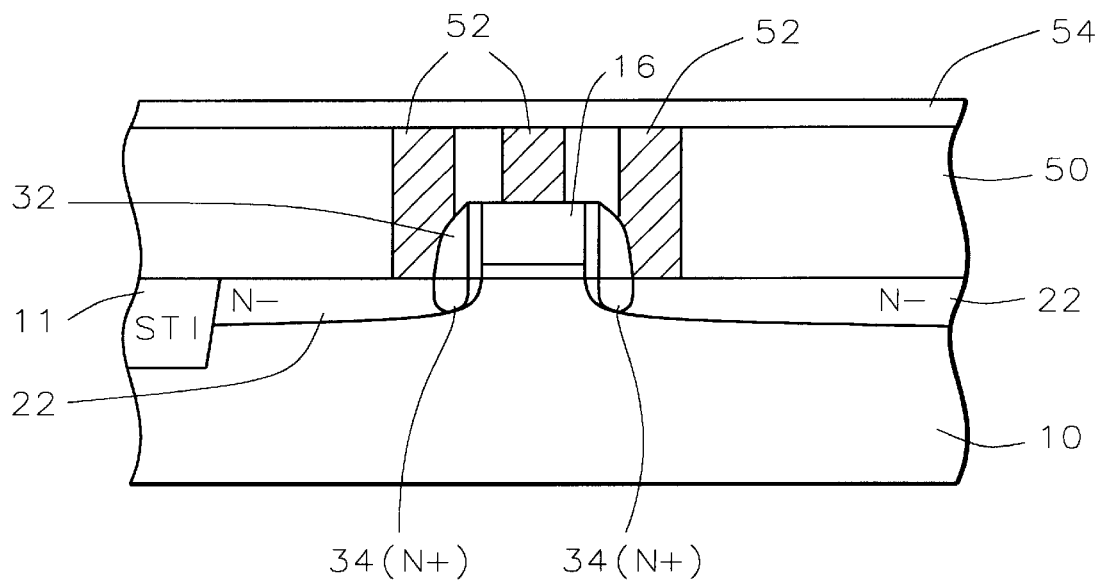
FIG. 10 illustrates a completed integrated circuit device fabricated according to the present invention.

The integrated circuit device is completed as is conventional in the art. For example, as illustrated in FIG. 10, insulating layer 50 is deposited over the surface of the substrate. Contact openings are made through the insulating layer to the underlying semiconductor devices, such as to the gate and the elevated source/drain. A metal layer 52 is deposited and patterned to form electrical connections between the elements of the integrated circuit. A passivation layer 54 completes the fabrication of the integrated circuit.

The process of the invention provides a sub-quarter-micron MOSFET device with an elevated source/drain structure having reduced short channel effects. The use of the polysilcion spacers 32 as an elevated source/drain reduces short channel effects without junction leakage problems presented by shallow source/drain junctions.

While the invention has been particularly shown and described with reference to the preferred embodiments thereof, it will be understood by those skilled in the art that various changes in form and details may be made without departing from the spirit and scope of the invention.

What is claimed is:

1. A method of forming a MOSFET having an elevated source/drain structure in the fabrication of an integrated circuit device comprising:

forming a gate electrode over a gate dielectric on a substrate;

implanting ions into said substrate to form lightly doped regions using said gate electrode as a mask;

thereafter forming dielectric spacers on sidewalls of said gate electrode;

depositing a polysilicon layer overlying said substrate, said gate electrode, and said dielectric spacers wherein said polysilicon layer is heavily doped;

anisotropically etching back said polysilicon layer to leave polysilicon spacers on said dielectric spacers;

diffusing dopant from said polysilicon spacers into said substrate to form source and drain extension regions underlying said polysilicon spacers;

removing said polysilicon spacer on an end of said gate electrode to separate said polysilicon spacers into a source polysilicon spacer and a drain polysilicon spacer thereby completing formation of said elevated source/drain structure;

thereafter depositing an insulating layer overlying said elevated source/drain structure and forming contact openings in said insulating layer to expose said lightly doped regions, said source polysilicon spacer, and said drain polysilicon spacer; and depositing a contact layer within said contact openings to form an electrical connection to complete fabrication of said MOSFET integrated circuit device.

2. The method according to claim 1 wherein said step of forming said dielectric spacers comprises:

depositing an oxide layer overlying said semiconductor substrate and said gate electrode; and etching back said oxide layer to leave said dielectric spacers only on sidewalls of said gate electrode.

3. The method according to claim 1 wherein said step of forming said dielectric spacers comprises:

oxidizing said semiconductor substrate and said gate electrode to form an oxide layer overlying said semiconductor substrate and said gate electrode; and etching away said oxide layer overlying said semiconductor substrate and a top surface of said gate electrode to leave said dielectric spacers only on sidewalls of said gate electrode.

4. The method according to claim 1 wherein said polysilicon layer is deposited by LPCVD to a thickness of between about 500 and 4000 Angstroms.

5. The method according to claim 1 wherein said polysilicon layer is in-situ doped.

6. The method according to claim 1 wherein said polysilicon layer is doped by ion implantation.

7. The method according to claim 1 wherein said polysilicon layer has a dopant concentration of between about $10^{20}$ and $10^{22}$ atoms/cm$^3$.

8. A method of forming a MOSFET having an elevated source/drain structure in the fabrication of an integrated circuit device comprising:

forming a gate electrode over a gate dielectric on a substrate;

implanting ions into said substrate to form lightly doped regions using said gate electrode as a mask;

thereafter forming dielectric spacers on sidewalls of said gate electrode;

depositing a polysilicon layer overlying said substrate, said gate electrode, and said dielectric spacers wherein said polysilicon layer is heavily doped;

anisotropically etching back said polysilicon layer to leave polysilicon spacers on said dielectric spacers wherein said polysilicon spacers form elevated source/drain regions;

diffusing dopant from said elevated source/drain regions into said substrate using a rapid thermal process to form source and drain extension regions underlying said elevated source/drain regions; and removing said polysilicon spacer on an end of said gate electrode to separate said elevated source/drain regions into an elevated source region and an elevated drain region thereby completing formation of said elevated source/drain structure;

thereafter depositing an insulating layer overlying said elevated source/drain structure and forming contact openings in said insulating layer to expose said lightly doped regions, said source polysilicon spacer, and said drain polysilicon spacer; and depositing a contact layer within said contact openings to form an electrical connection to complete fabrication of said MOSFET integrated circuit 35 device.

9. The method according to claim 8 wherein said step of forming said dielectric spacers comprises:

depositing an oxide layer overlying said semiconductor substrate and said gate electrode; and etching back said oxide layer to leave said dielectric spacers only on sidewalls of said gate electrode.

10. The method according to claim 8 wherein said step of forming said dielectric spacers comprises:

oxidizing said semiconductor substrate and said gate electrode to form an oxide layer overlying said semiconductor substrate and said gate electrode; and etching away said oxide layer overlying said semiconductor substrate and a top surface of said gate electrode to leave said dielectric spacers only on sidewalls of said gate electrode.

11. The method according to claim 8 wherein said polysilicon layer is in-situ doped.

12. The method according to claim 8 wherein said polysilicon layer is doped by ion implantation.

13. The method according to claim 8 wherein said polysilicon layer has a dopant concentration of between about $10^{20}$ and $10^{22}$ atoms/cm$^3$.

14. The method according to claim 8 wherein said polysilicon layer is deposited by LPCVD to a thickness of between about 500 and 4000 Angstroms.

15. A method of forming a MOSFET having an elevated source/drain structure in the fabrication of an integrated circuit device comprising:

forming a gate electrode over a gate dielectric on a substrate;

implanting ions into said substrate to form lightly doped regions using said gate electrode as a mask;

thereafter depositing a dielectric layer overlying said semiconductor substrate and said gate electrode;

etching back said dielectric layer to leave dielectric spacers only on sidewalls of said gate electrode;

depositing a polysilicon layer overlying said substrate, said gate electrode, and said dielectric spacers wherein said polysilicon layer is heavily doped;

anisotropically etching back said polysilicon layer to leave polysilicon spacers on said dielectric spacers wherein said polysilicon spacers form elevated source/drain regions;

diffusing dopant from said elevated source/drain regions into said substrate to form source and drain extension regions underlying said elevated source/drain regions; and removing said polysilicon spacer on an end of said gate electrode to separate said elevated source/drain regions into an elevated source region and an elevated drain region thereby completing formation of said elevated source/drain structure;

thereafter depositing an insulating layer overlying said elevated source/drain structure and forming contact openings in said insulating layer to expose said lightly doped regions, said source polysilicon spacer, and said drain polysilicon spacer; and depositing a contact layer within said contact openings to form an electrical connection to complete fabrication of said MOSFET integrated circuit device.

16. The method according to claim 15 wherein said polysilicon layer is in-situ doped.

17. The method according to claim 15 wherein said polysilicon layer is doped by ion implantation.

18. The method according to claim 15 wherein said polysilicon layer has a dopant concentration of between about $10^{20}$ and $10^{22}$ atoms/cm$^3$.

19. The method according to claim 15 wherein said step of diffusing dopant from said polysilicon spacers into said semiconductor substrate to form source and drain regions is performed by a rapid thermal process.

* * * * *